(12) United States Patent
Oman

(10) Patent No.: US 7,659,615 B2
(45) Date of Patent: Feb. 9, 2010

(54) HIGH POWER PACKAGE WITH DUAL-SIDED HEAT SINKING

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 384 days.

(21) Appl. No.: 11/799,916

(22) Filed: May 3, 2007

(65) Prior Publication Data

US 2008/0272483 A1 Nov. 6, 2008

(51) Int. Cl.
*H01L 23/34* (2006.01)
*H01L 23/15* (2006.01)

(52) U.S. Cl. .................... 257/713; 257/706; 257/780; 257/E23.101

(58) Field of Classification Search ............. 257/713, 257/706, 780, E23.101; 361/709
See application file for complete search history.

(56) References Cited

U.S. PATENT DOCUMENTS

| | | | | |
|---|---|---|---|---|
| 5,646,828 A | * | 7/1997 | Degani et al. ............... | 361/715 |
| 6,219,243 B1 | * | 4/2001 | Ma et al. .................... | 361/704 |
| 6,282,095 B1 | * | 8/2001 | Houghton et al. ........... | 361/704 |
| 6,490,161 B1 | * | 12/2002 | Johnson ..................... | 361/704 |
| 7,002,247 B2 | * | 2/2006 | Mok et al. .................. | 257/713 |
| 7,235,880 B2 | * | 6/2007 | Prokofiev ................... | 257/734 |
| 7,268,425 B2 | * | 9/2007 | Mallik et al. ................ | 257/706 |
| 2006/0006525 A1 | * | 1/2006 | Mullen et al. ............... | 257/712 |
| 2006/0043581 A1 | * | 3/2006 | Prokofiev ................... | 257/713 |

* cited by examiner

*Primary Examiner*—Nitin Parekh
(74) *Attorney, Agent, or Firm*—Jimmy L. Funke

(57) ABSTRACT

An assembly includes a semiconductor die disposed between an upper substrate and a lower substrate. A circuit board that defines a through hole is spaced axially below the upper substrate to define a gap between the upper substrate and the circuit board. An upper heat sink is thermally connected to the upper substrate by an upper thermal interface material to transfer heat in a first dissipation path to the upper heat sink. A lower heat sink is thermally connected to the lower substrate by a lower thermal interface material to transfer heat in a second dissipation path to the lower heat sink. A plurality of first interconnectors are disposed in the gap to solder the upper substrate to the circuit board. The assembly is distinguished by a plurality of second interconnectors that are disposed between the upper substrate and the lower substrate to position the lower substrate in the through hole of the circuit board.

23 Claims, 3 Drawing Sheets

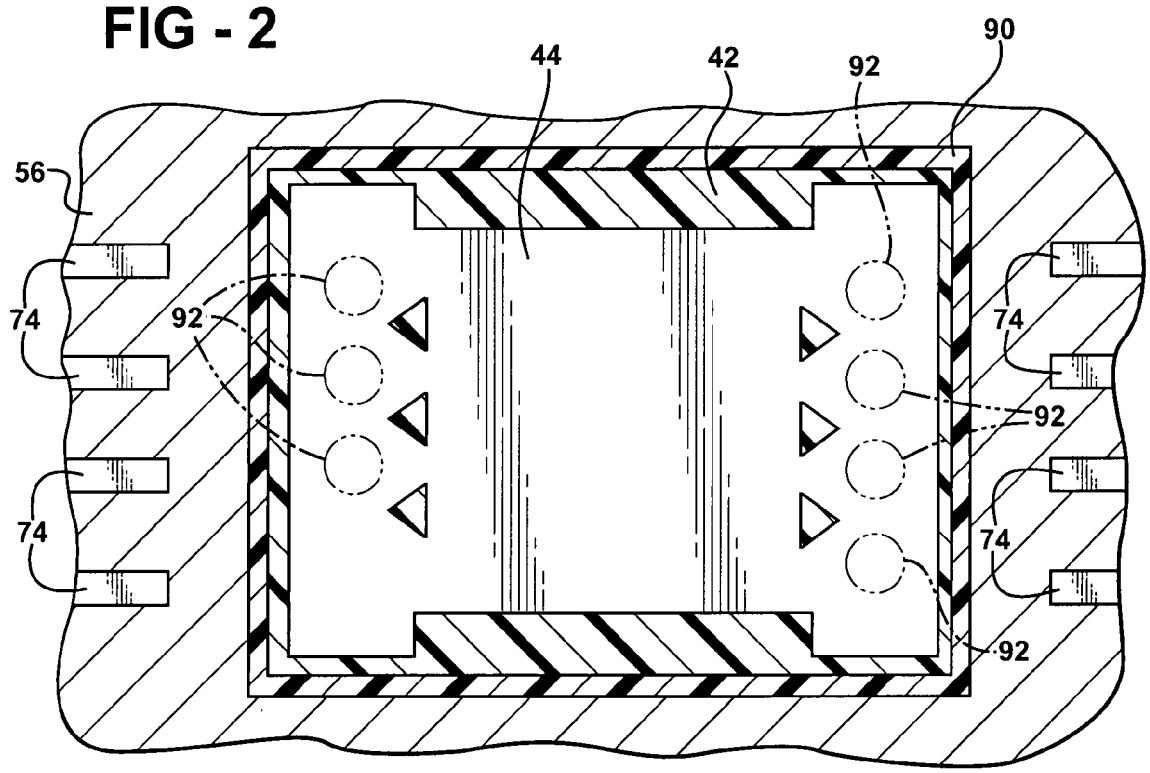
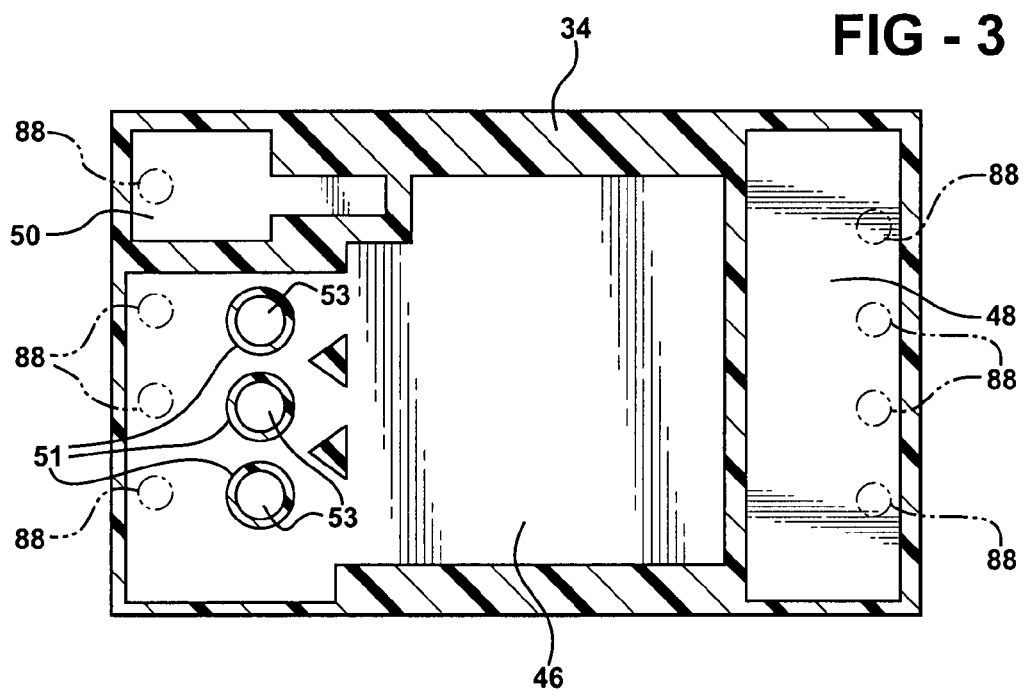

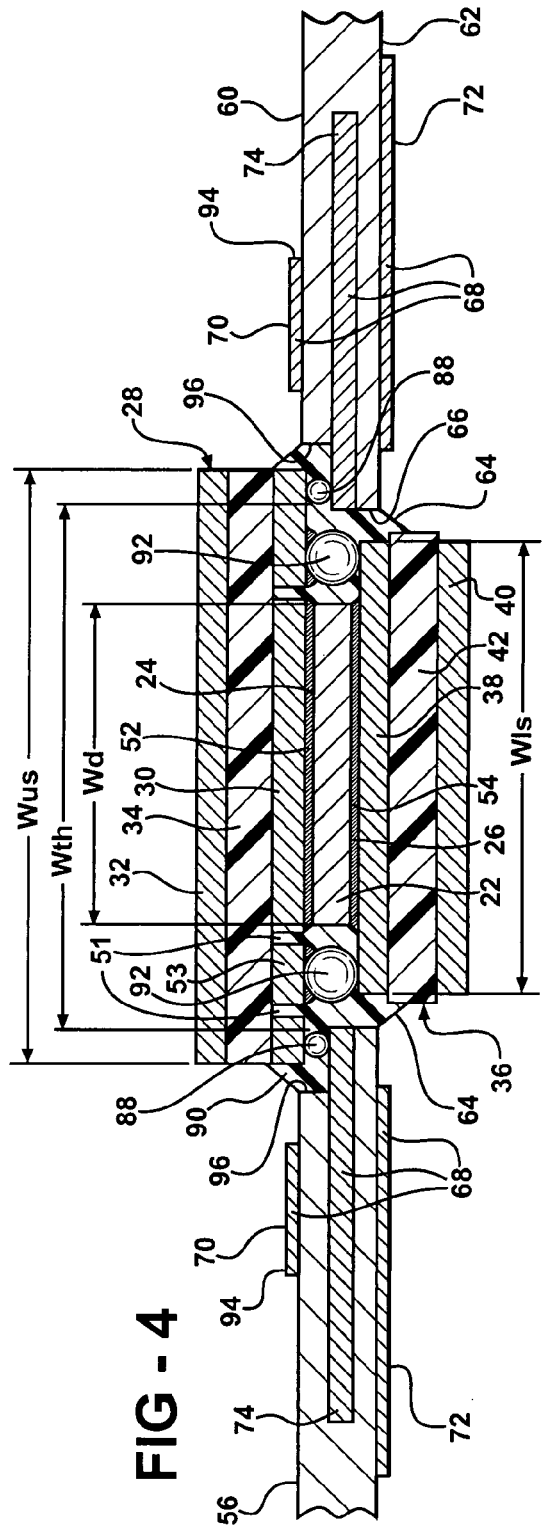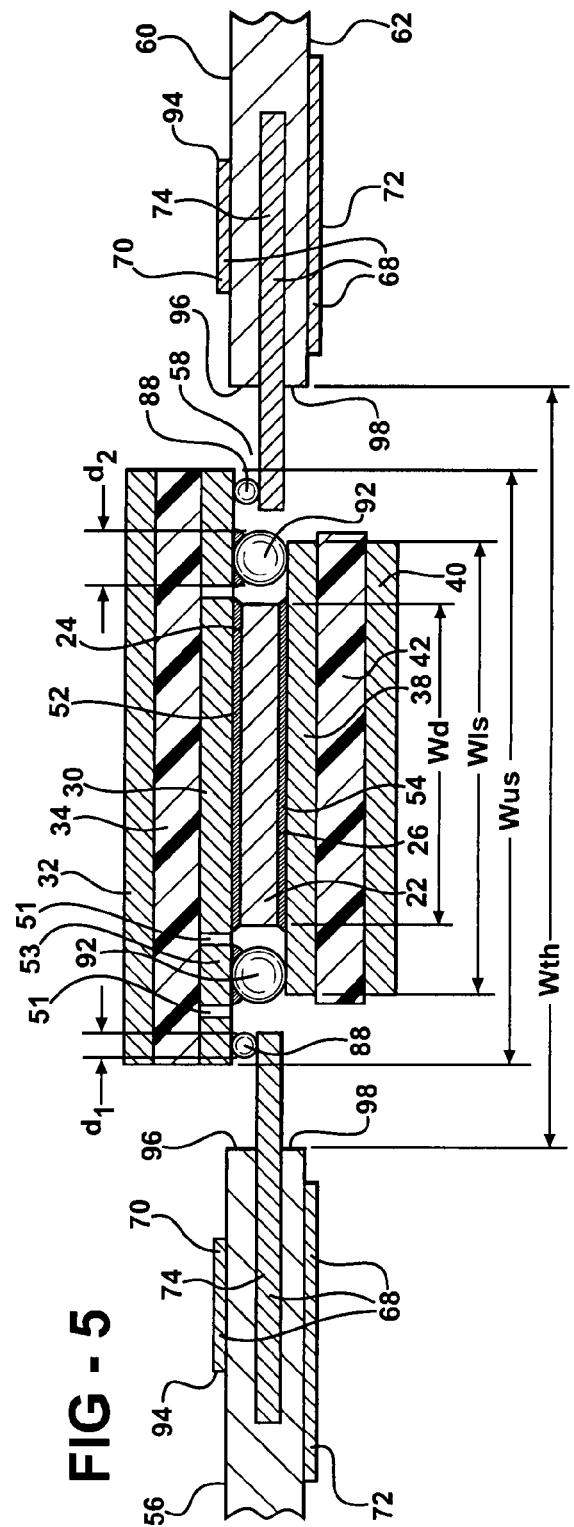

HIGH POWER PACKAGE WITH DUAL-SIDED HEAT SINKING

BACKGROUND OF THE INVENTION

1. Field of the Invention

The subject invention relates to an assembly for cooling a power device.

2. Description of the Prior Art

Electronic semiconductor device technology continues to rapidly advance, producing devices that achieve heretofore unattainable operating speeds, packing density, and high-temperature compatibility. This last characteristic, high-temperature compatibility, is one of the more important features. High-temperature environments as well as high-power and high frequency applications are becoming increasingly important.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection, such as hermetic sealing.

In designing such packages, thermal management is important, especially at high power generation levels which increase the amount of heat created. Heat decreases the performance and operating life of the transistor. Moreover, heat generated at the collector-base junction can create a temperature buildup which may eventually cause the device to short-circuit. The power device may be mounted on a thermally conductive pad which acts as a heat sink and dissipates the heat generated by the power device.

Two examples of such a system are disclosed in U.S. Pat. No. 7,005,734 to Choi et al (the '734 patent) and U.S. Publication 2004/0173901 to Mallik et al (the Mallik publication).

The '734 patent discloses an assembly that includes a semiconductor die that extends radially from an axis and includes an upper surface and a lower surface. An upper substrate is disposed axially above the upper surface of the die to provide a first heat dissipation path from the die through the upper substrate. A lower substrate is disposed axially below the lower surface of the die for providing a second heat dissipation path from the die through the lower substrate.

The Mallik publication discloses an assembly that includes a semiconductor die that extends radially from an axis and includes an upper surface and a lower surface. An upper substrate is disposed axially above the upper surface of the die to provide a first heat dissipation path from the die through the upper substrate. A circuit board is spaced axially below the upper substrate to define a gap between the upper substrate and the circuit board. The circuit board defines a through hole having a periphery about the axis and includes a plurality of circuit board conductors. A plurality of first interconnectors are disposed in the gap and at the ends opposite one another of the upper substrate to create electrical conduction between at least one of the circuit board conductors of the circuit board and the upper substrate.

Although the prior art increases cooling capabilities, there is a continuing need for a simple, reliable apparatus to fabricate packages for electronic chips, so that the package provides high heat conductivity and dissipation, and high frequency response.

SUMMARY OF THE INVENTION AND ADVANTAGES

The subject invention provides such an assembly which includes a plurality of second interconnectors disposed radially inward of the first interconnectors and between the upper substrate and the lower substrate to position the lower substrate in the through hole of the circuit board and to connect the upper and lower substrates and allow for the flow of current between the upper and lower substrates.

Accordingly, the subject invention is electrically isolated at the top and bottom of the assembly to provide for dual-sided heat sinking. The assembly of the subject invention includes: a large bond surface for distributed current and heat; increased reliability due to improved thermal performance; reduced stress on the solder joints for thermal expansion; lower RDSon and inductance for improved electrical and thermal performance; built-in EMI shielding; and a reduced foot print.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2 is a cross-sectional view taken along line 2-2 of FIG. 1 showing the third conductive layer of the lower substrate;

FIG. 3 is a cross-sectional view taken along line 3-3 of FIG. 1 showing the first conductive layer of the upper substrate;

FIG. 4 is a fragmentary cross-sectional view of a second embodiment of the subject invention; and FIG. 5 is a fragmentary cross-sectional view of a third embodiment of the subject invention.

DETAILED DESCRIPTION OF THE INVENTION

Figure 1:
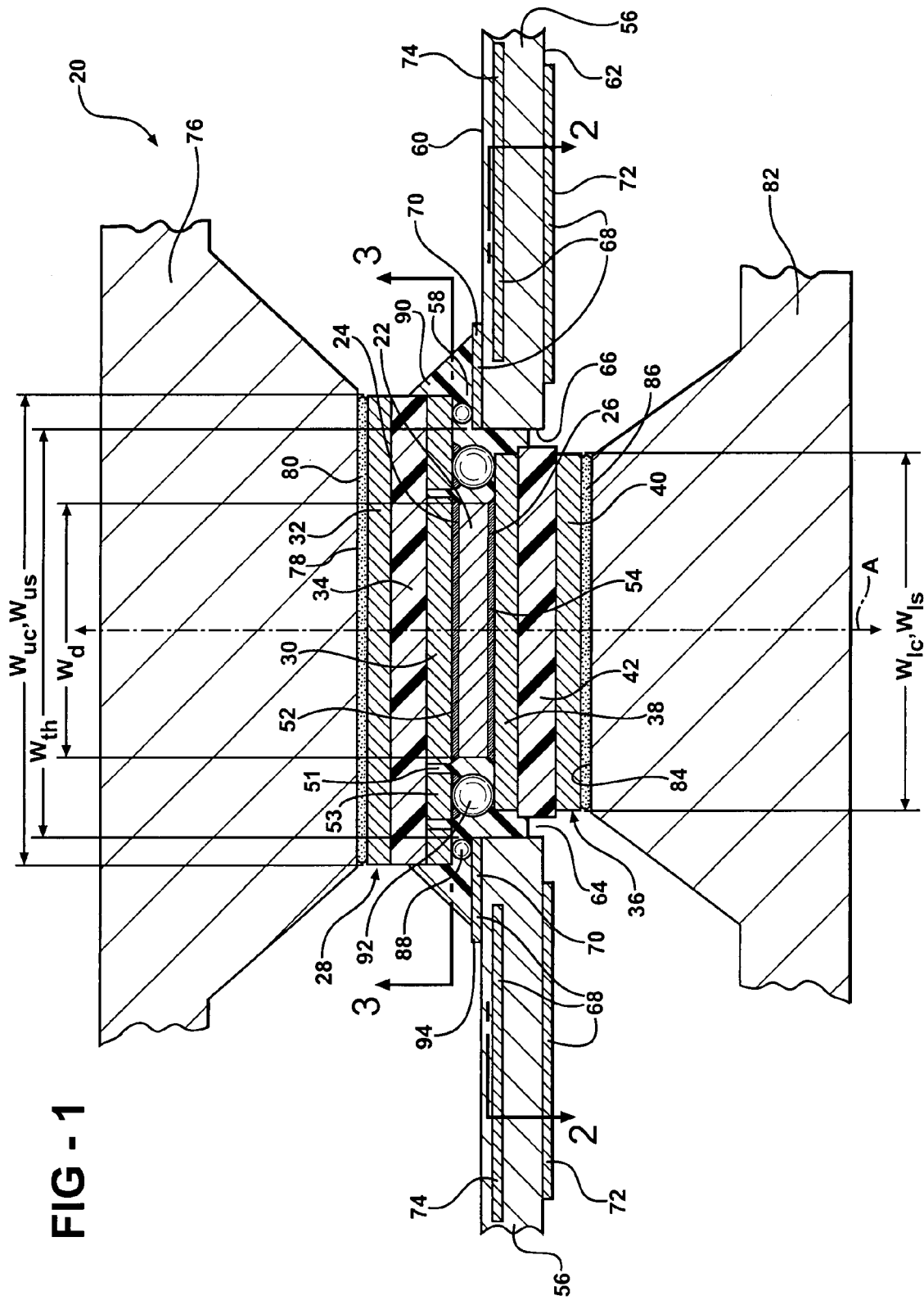
FIG. 1 is a fragmentary cross-sectional view of a first embodiment of the subject invention.

Referring to the Figures, wherein like numerals indicate corresponding parts throughout the several views, an assembly 20 is generally shown for cooling a power device.

The assembly 20 includes a semiconductor die 22 that extends radially from an axis A and includes an upper surface 24 and a lower surface 26. The die 22 is generally rectangular with a die length $I_d$ and a die width $w_d$, but may be any shape known in the art.

The assembly 20 includes an upper substrate 28 generally indicated that is spaced axially above the upper surface 24 of the die 22, and has an upper substrate width $w_{us}$ greater than the die width $w_d$. The upper substrate 28 has a first conductive layer 30 that overlies the die 22, a second conductive layer 32 that is generally rectangular and spaced axially above the first conductive layer 30, and an upper electrically insulating layer 34 that is brazed between the first and second conductive layers 30, 32. The first and second conductive layers 30, 32 are copper, but may be any conductive material known in the art. The upper electrically insulating layer 34 is silicon nitride, aluminum nitride, or any insulating material known in the art. The upper substrate 28 not only provides electrical isolation, but also a low thermal resistance structure that is closely matched to silicon's coefficient of thermal expansion which reduces the stress on the assemblies 20 solder joints.

The assembly 20 includes a lower substrate 36 generally indicated that is spaced axially below the lower surface 26 of the die 22 and has a lower substrate width $w_{ls}$ that is greater than the die width $w_d$ but less than the upper substrate width $w_{us}$. The lower substrate 36 includes a third conductive layer 38 that underlies the die 22, a fourth conductive layer 40 that is generally rectangular and spaced axially below the third conductive layer 38, and a lower electrically insulating layer 42 that is brazed between the third and fourth conductive layers 38, 40. The third and fourth conductive layers 38, 40 are copper, but may be any conductive material known in the art. The lower electrically insulating layer 42 is silicon nitride, aluminum nitride, or any insulating material known in the art. The lower substrate 36 not only provides electrical isolation, but also a low thermal resistance structure that is closely matched to silicon's coefficient of thermal expansion which reduces the stress on the assemblies 20 solder joints.

The third conductive layer 38 includes a lower drain 44 and the first conductive layer 30 includes a source 46, an upper drain 48 radially spaced from the source 46, and a gate 50 that allows current to flow between the lower drain 44 and the source 46. The source 46 includes a plurality of isolation rings 51 that prevent a short between the source 46 and the lower drain 44. Each of the isolation rings 51 define a circular support pad 53 to providing a mechanical support for upper substrate 28.

An upper solder layer 52 is disposed between the upper surface 24 of the die 22 and the first conductive layer 30. The upper solder layer 52 bonds the die 22 to the upper substrate 28 and provides a first heat dissipation path from the die 22 through the upper substrate 28. A lower solder layer 54 is disposed between the lower surface 26 of the die 22 and the third conductive layer 38. The lower solder layer 54 bonds the die 22 to the lower substrate 36 and provides a second heat dissipation path from the die 22 through the lower substrate 36.

The assembly 20 includes a circuit board 56 that is spaced axially below the upper substrate 28 to define a gap 58. The circuit board 56 is generally rectangular and has a top surface 60 and a bottom surface 62. The circuit board 56 is made of Alumina, FR4, or any other material known in the art. The circuit board 56 defines a rectangular through hole 64 having a periphery 66 about the axis A. The through hole 64 has a through hole width $w_{th}$ that is greater than the die width $w_d$ and the lower substrate width $w_{ls}$.

The circuit board 56 includes a plurality of circuit board conductors 68 that include a plurality of top conductors 70, a plurality of bottom conductors 72, and a plurality of inner conductors 74. The circuit board conductors 68 are copper and are generally rectangular, but may be any material and shape known in the art. The plurality of top conductors 70 are disposed on the top surface 60 of the circuit board 56 and spaced along the periphery 66. The plurality of bottom conductors 72 are disposed on the bottom surface 62 of the circuit board 56 and spaced along the periphery 66. The plurality of inner conductors 74 are disposed within the circuit board 56 between the top and bottom surfaces 60, 62 and spaced along the periphery 66.

An upper heat sink 76 is axially spaced above the upper substrate 28. The upper heat sink 76 includes an upper contact surface 78 that is generally rectangular and has an upper contact width $w_{uc}$ equal to or greater than the upper substrate width $w_{us}$. The upper heat sink 76 extends radially outward as it extends axially upward from the upper contact surface 78. An upper thermal interface material 80 is disposed between the upper contact surface 78 of the upper heat sink 76 and the upper substrate 28. The upper thermal interface material 80 thermally connects and minimizes the air pockets between the upper contact surface 78 of the upper heat sink 76 and the upper substrate 28 to transfer heat in the first dissipation path to the upper heat sink 76.

A lower heat sink 82 is axially spaced below the lower substrate 36. The lower heat sink 82 includes a lower contact surface 84 that is generally rectangular and has a lower contact width $w_{lc}$ equal to or greater then the lower substrate width $w_{ls}$. The lower heat sink 82 extends radially outward as it extends axially downward from the lower contact surface 84. A lower thermal interface material 86 is disposed between the lower contact surface 84 of the lower heat sink 82 and the lower substrate 36. The lower thermal interface material 86 thermally connects and minimizes the air pockets between the lower contact surface 84 of the lower heat sink 82 and the lower substrate 36 to transfer heat in the second dissipation path to the lower heat sink 82.

A plurality of first interconnectors 88 are disposed in the gap 58 and at the ends opposite one another of the first conductive layer 30. The first interconnectors 88 are copper and sphere shaped but may be any material and shape known in the art. The first interconnectors 88 have a first diameter $d_1$ for soldering the gate 50, the source 46, and the upper drain 48 of the first conductive layer 30 to the circuit board conductors 68. An epoxy filler 90 is disposed in the through hole 64, the gap 58, and the isolation rings 51 for encasing the die 22 and bonding the upper substrate 28 to the circuit board 56. The first diameter $d_1$ is determined based on the desired gap 58 for the epoxy filler 90.

The assembly 20 is distinguished by a plurality of second interconnectors 92 that are disposed radially inward of the first interconnectors 88 and between the upper substrate 28 and the lower substrate 36. The second interconnectors 92 position the lower substrate 36 in the through hole 64 of the circuit board 56 and connect the first and third conductive layers 30, 38 to allow for the flow of current between the first and third conductive layers 30, 38. The second interconnectors 92 are copper and sphere shaped but may be any material and shape known in the art. The second interconnectors 92 have a second diameter $d_2$ that is determined by the thickness of the die 22 and the upper and lower solder layers 52, 54. The second diameter $d_2$ may be larger or smaller than the first diameter $d_1$. The second interconnectors 92 that are disposed between the source 46 and the lower drain 44 are soldered to each of the support pads 53.

In a first embodiment of the subject invention each of the top conductors 70 begins at the periphery 66 and extends radially away from the periphery 66 to a distal end 94. Each of the top conductors 70 is soldered to one of the first interconnectors 88 to create electrical conduction between the circuit board 56 and the upper substrate 28.

In a second embodiment of the subject invention, as shown in FIG. 4, the circuit board 56 includes an upper recess 96 that extends axially downward from the top surface 60 of the circuit board 56 and radially outward from the periphery 66 to expose the top of each of the inner conductors 74. Each of the inner conductors 74 is soldered to one of the first interconnectors 88 to create electrical conduction between the circuit board 56 and the upper substrate 28.

In a third embodiment of the subject invention, as shown in FIG. 5, the circuit board 56 includes a lower recess 98 that extends axially upward from the bottom surface 62 of the circuit board 56 and radially outward from the periphery 66 to expose the bottom of each of the inner conductors 74. Each of the inner conductors 74 is soldered to one of the first interconnectors 88 to create electrical conduction between the circuit board 56 and the upper substrate 28.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An assembly for cooling a power device comprising;
a semiconductor die extending radially from an axis and having an upper surface and a lower surface,
an upper substrate disposed axially above said upper surface of said die for providing a first heat dissipation path from said die through said upper substrate,
a lower substrate disposed axially below said lower surface of said die for providing a second heat dissipation path from said die through said lower substrate,
a circuit board spaced axially below said upper substrate to define a gap between said upper substrate and said circuit board and said circuit board defining a through hole having a periphery about said axis and including a plurality of circuit board conductors,
a plurality of first interconnectors disposed in said gap and at the ends opposite one another of said upper substrate for creating electrical conduction between at least one of said circuit board conductors of said circuit board and said upper substrate, and
said assembly including a plurality of second interconnectors disposed radially inward of said first interconnectors and between said upper substrate and said lower substrate for positioning said lower substrate in said through hole of said circuit board and for connecting said upper and lower substrates and allowing for the flow of current between said upper and lower substrates.

2. An assembly as set forth in claim 1 including an upper heat sink spaced axially above said upper substrate for transferring heat from the first dissipation path to said upper heat sink.

3. An assembly as set forth in claim 2 including a lower heat sink spaced axially below said lower substrate for transferring heat from the second dissipation path to said lower heat sink.

4. An assembly as set forth in claim 3 wherein said upper substrate includes a first conductive layer overlying said die, a second conductive layer being generally rectangular and spaced axially above said first conductive layer, and an upper electrically insulating layer disposed between said first and second conductive layers.

5. An assembly as set forth in claim 4 wherein said lower substrate includes a third conductive layer underlying said die, a fourth conductive layer being generally rectangular and spaced axially below said third conductive layer, and a lower electrically insulating layer disposed between said third and fourth conductive layers.

6. An assembly as set forth in claim 5 wherein said circuit board includes a top surface and a bottom surface and said circuit board conductors are generally rectangular and include a plurality of top conductors disposed on said top surface of said circuit board and spaced along said periphery, a plurality of bottom conductors disposed on said bottom surface of said circuit board and spaced along said periphery, and a plurality of inner conductors disposed within said circuit board and spaced along said periphery.

7. An assembly as set forth in claim 6 including an upper solder layer disposed between said upper surface of said die and said first conductive layer for bonding said die to said upper substrate and a lower solder layer disposed between said lower surface of said die and said third conductive layer for bonding said die to said lower substrate.

8. An assembly as set forth in claim 7 including an upper thermal interface material disposed between said upper substrate and said upper heat sink for thermally connecting said upper substrate to said upper heat sink, and a lower thermal interface material disposed between said lower substrate and said lower heat sink for thermally connecting said lower substrate to said lower heat sink.

9. An assembly as set forth in claim 8 wherein said third conductive layer includes a lower drain and said first conductive layer includes a source, an upper drain radially spaced from said source, and a gate for allowing current to flow between said lower drain and said source.

10. An assembly as set forth in claim 9 wherein said source includes a plurality of isolation rings for preventing a short between said source and said lower drain, each of said isolation rings defining a circular support pad for providing mechanical support to said upper substrate, and wherein each of said second interconnectors that are disposed between said source and said lower drain are soldered to one of said support pads.

11. An assembly as set forth in claim 10 including an epoxy filler disposed in said through hole, said gap, and said isolation rings for encasing said die and bonding said upper substrate to said circuit board.

12. An assembly as set forth in claim 11 wherein said semiconductor die is generally rectangular with a die length and a die width, said upper substrate is generally rectangular having an upper substrate width greater than said die width, and said lower substrate is generally rectangular having a lower substrate width greater than said die width and less than said upper substrate width.

13. An assembly as set forth in claim 12 wherein said circuit board and said through hole are generally rectangular, and wherein said through hole includes a through hole width greater than said die width and said lower substrate width.

14. An assembly as set forth in claim 13 wherein said upper heat sink includes an upper contact surface being generally rectangular and having an upper contact width at least equal to said upper substrate width, said upper heat sink extends radially outward as it extends axially away from said upper contact surface, and said upper thermal interface material is disposed between said upper contact surface of said upper heat sink and said upper substrate for thermally connecting said upper contact surface of said upper heat sink to said upper substrate.

15. An assembly as set forth in claim 14 wherein said lower heat sink includes a lower contact surface being generally rectangular and having a lower contact width at least equal to said lower substrate width and less than said through hole width, said lower heat sink extends radially outward as it extends axially downward from said lower contact surface, and said lower thermal interface material is disposed between said lower contact surface of said lower heat sink and said lower substrate for thermally connecting said lower contact surface of said lower heat sink to said lower substrate.

16. An assembly as set forth in claim 15 wherein said first conductive layer, said second conductive layer, said third conductive layer, said fourth conductive layer, said first interconnectors, said second interconnectors, said circuit board conductors, and said support pad are copper.

17. An assembly as set forth in claim 6 wherein each of said top conductors begin at said periphery and extend radially away from said periphery to a distal end, with each of said top conductors being soldered to one of said first interconnectors for creating electrical conduction between said circuit board and said upper substrate.

18. An assembly as set forth in claim 6 wherein said circuit board includes an upper recess extending axially downward from said top surface of said circuit board and radially outward from said periphery for exposing the top of each of said inner conductors, each of said inner conductors being soldered to one of said first interconnectors for creating electrical conduction between said circuit board and said upper substrate.

19. An assembly as set forth in claim 18 wherein said circuit board includes a lower recess extending axially upward from said bottom surface of said circuit board and radially outward from said periphery for exposing the bottom of each of said inner conductors, each of said inner conductors being soldered to one of said first interconnectors for creating electrical conduction between said circuit board and said upper substrate.

20. An assembly for cooling a power device comprising;

a semiconductor die being generally rectangular with a die length and a die width and extending radially from an axis and having an upper surface and a lower surface, an upper substrate spaced axially above said upper surface of said die and having an upper substrate width greater than said die width, said upper substrate including a first conductive layer of copper overlying said die and a second conductive layer of copper and being generally rectangular and spaced axially above said first conductive layer and an upper electrically insulating layer brazed between said first and second conductive layers, an upper solder layer disposed between said upper surface of said die and said first conductive layer for bonding said die to said upper substrate and for providing a first heat dissipation path from said die through said upper substrate, a lower substrate spaced axially below said lower surface of said die and having a lower substrate width greater than said die width and less than said upper substrate width, said lower substrate including a third conductive layer of copper underlying said die and a fourth conductive layer of copper and being generally rectangular and spaced axially below said third conductive layer and a lower electrically insulating layer brazed between said third and fourth conductive layers, a lower solder layer disposed between said lower surface of said die and said third conductive layer for bonding said die to said lower substrate and for providing a second heat dissipation path from said die through said lower substrate, said third conductive layer having a lower drain and said first conductive layer having a source and an upper drain radially spaced from said source and a gate for allowing current to flow between said lower drain and said source, said source having a plurality of isolation rings for preventing a short between said source and said lower drain and each of said isolation rings defining a circular support pad of copper for providing mechanical support to said upper substrate, a circuit board spaced axially below said upper substrate to define a gap and having a top surface and a bottom surface and being generally rectangular and defining a rectangular through hole having a periphery about said axis and said through hole having a through hole width greater than said die width and said lower substrate width, said circuit board having a plurality of circuit board conductors of copper and each being generally rectangular and including a plurality of top conductors and plurality of bottom conductors and a plurality of inner conductors, said plurality of top conductors being disposed on said top surface of said circuit board and spaced along said periphery, said plurality of bottom conductors being disposed on said bottom surface of said circuit board and spaced along said periphery, said plurality of inner conductors being disposed within said circuit board and spaced along said periphery, an upper heat sink being axially spaced above said upper substrate and having an upper contact surface being generally rectangular and having an upper contact width at least equal to said upper substrate width and said upper heat sink extending radially outward as it extends axially upward from said upper contact surface, an upper thermal interface material disposed between said upper contact surface of said upper heat sink and said upper substrate for thermally connecting said upper contact surface of said upper heat sink to said upper substrate for transferring heat in the first dissipation path to said upper heat sink, a lower heat sink being axially spaced below said lower substrate and having a lower contact surface being generally rectangular and having a lower contact width at least equal to said lower substrate width and said lower heat sink extending radially outward as it extends axially downward from said lower contact surface, a lower thermal interface material disposed between said lower contact surface of said lower heat sink and said lower substrate for thermally connecting said lower contact surface of said lower heat sink to said lower substrate for transferring heat in the second dissipation path to said lower heat sink, a plurality of first interconnectors of copper disposed in said gap and at the ends opposite one another of said first conductive layer and being sphere shaped and having a first diameter for soldering said gate and said source and said upper drain of said first conductive layer to said circuit board conductors, an epoxy filler disposed in said through hole and said gap and said isolation rings for encasing said die and bonding said upper substrate to said circuit board, and said assembly including a plurality of second interconnectors of copper and being sphere shaped and having a second diameter larger than said first diameter and disposed radially inward of said first interconnectors and between said upper substrate and said lower substrate for positioning said lower substrate in said through hole of said circuit board and for connecting said first and third conductive layers and allowing for the flow of current between said first and third conductive layers and wherein each of said second interconnectors disposed between said source and said lower drain are soldered to one of said support pads.

21. An assembly as set forth in claim 20 wherein each of said top conductors begin at said periphery and extend radially away from said periphery to a distal end, with each of said top conductors being soldered to one of said first interconnectors for creating electrical conduction between said circuit board and said upper substrate.

22. An assembly as set forth in claim 20 wherein said circuit board includes an upper recess extending axially downward from said top surface of said circuit board and radially outward from said periphery for exposing the top of each of said inner conductors, each of said inner conductors being soldered to one of said first interconnectors for creating electrical conduction between said circuit board and said upper substrate.

23. An assembly as set forth in claim 22 wherein said circuit board includes a lower recess extending axially upward from said bottom surface of said circuit board and radially outward from said periphery for exposing the bottom of each of said inner conductors, each of said inner conductors being soldered to one of said first interconnectors for creating electrical conduction between said circuit board and said upper substrate.

* * * * *